(12) United States Patent
Akatsu et al.

(10) Patent No.: US 6,319,794 B1
(45) Date of Patent: Nov. 20, 2001

(54) STRUCTURE AND METHOD FOR PRODUCING LOW LEAKAGE ISOLATION DEVICES

(75) Inventors: Hiroyuki Akatsu; Tze-Chiang Chen, both of Yorktown Heights; Laertis Economikos, Wappingers Falls; Herbert L. Ho, New Windsor; Richard Kleinhenz, Wappingers Falls; Jack A. Mandelman, Stormville; Wesley C. Natzle, New Paltz, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/172,697

(22) Filed: Oct. 14, 1998

(51) Int. Cl.[7] .................................................. H01L 21/76
(52) U.S. Cl. ........................ 438/424; 438/427; 438/439; 438/444; 438/700
(58) Field of Search .................... 438/425, 421, 438/426, 424, 439, 427, 444, 445, 700

(56) References Cited

U.S. PATENT DOCUMENTS 4,631,803 * 12/1986 Hunter et al. ................... 438/426
5,282,925    2/1994 Jeng et al. .
5,387,540 *  2/1995 Poon et al. ...................... 438/430
5,472,904 * 12/1995 Figura et al. .................... 438/426
5,474,953 * 12/1995 Shimizu et al. .................. 438/426
5,492,858 *  2/1996 Bose et al. ...................... 438/437
5,521,422    5/1996 Mandelman et al. .
5,604,159 *  2/1997 Cooper et al. ................... 438/281
5,763,315 *  6/1998 Benedict et al. ................. 438/424
5,766,971 *  6/1998 Ahlgren et al. .................. 438/296
5,874,317 *  2/1999 Stolmeijer ....................... 438/424
5,923,991 *  7/1999 Bronner et al. .................. 438/424

* cited by examiner

Primary Examiner—Carl Whitehead, Jr.
Assistant Examiner—Maria Guerrero
(74) Attorney, Agent, or Firm—Ratner & Prestia; H. Daniel Schnurmann

(57) ABSTRACT

A shallow trench isolation structure for a semiconductor device and the method for manufacturing the shallow trench isolation device within a semiconductor substrate. The shallow trench isolation structure is divot-free and includes un-annealed dielectric material as the trench fill material. The intersection of the structure and the semiconductor surface in which it is formed, is free of silicon nitride, but the isolation structure may include a silicon nitride liner which is within the trench and recessed below the semiconductor surface.

19 Claims, 10 Drawing Sheets

FIG. IA

STRUCTURE AND METHOD FOR PRODUCING LOW LEAKAGE ISOLATION DEVICES

FIELD OF THE INVENTION

The invention relates to semiconductor integrated circuit devices, most generally, and the processes for forming these devices. More specifically this invention relates to the materials, processes and structures used to produce low leakage transistors isolated by a shallow trench within a dynamic random access memory (DRAM) semiconductor integrated circuit device.

BACKGROUND OF THE INVENTION

Dynamic Random Access Memory (DRAM) structures capable of achieving high threshold voltage with minimal threshold implants are needed to minimize leakage and to obtain high chip yield. In today's semiconductor industry, with high-scale integration plus increased device complexities, isolation features are needed to allow for a maximum number of device features to be incorporated within a given area of a substrate. As such, isolation features such as shallow trench isolation structures are commonly added to integrated circuit devices such as DRAMs. The main source of leakage for storage trench DRAMs is buried strap leakage stemming from the array threshold ion implant. This implant is needed to provide sufficient threshold voltage to prevent sub-threshold leakage in the array. These leakages are tied to the physical structure of the device through the transistor at the steps, or corners of the main device formed where the main device adjoins the shallow trench isolation features.

Shallow trench isolation structures typically include a step, or corner at the intersection between the semiconductor substrate and the shallow trench isolation filler material, which typically extends above the semiconductor substrate. At the location where the polysilicon film, which forms the gates of transistors, extends over this step, an electric field is created. When a divot is formed at the intersection of the shallow trench isolation device and the semiconductor substrate, this electric field is enhanced. The divot produces an enhanced electric field at the corner of the gate, which lowers the threshold voltage, Vt, at the corner of the surface channel Metal Oxide Semiconductor Field Effect Transistor (MOSFET) devices, for example, an N-type MOSFET in the DRAM. This necessitates additional Vt implant which produces additional buried strap leakage. As the divot size increases, the required implant and associated leakage increases. The undesired formation of divots at the edges of shallow trench isolation devices is a common problem.

The conventional way to minimize divot formation and size is to anneal the oxide that is used to fill the shallow trench isolation. Annealing the oxide lowers the etch rate in aqueous hydrofluoric acid (HF), thereby minimizing the HF attack which creates the divots. The anneal can oxidize silicon in the deep and shallow trench, however, and produce defects that can destroy the device. Nitride liners in the shallow trench improve this condition, but create other defects. Even when such a nitride liner is present, annealing the shallow trench can contribute to other problems such as variable retention time problems.

The presence of the nitride liner along the sidewall of the trench may result in parasitic edge (sidewall) conduction in buried channel MOSFETs, such as the p-type Field Effect Transistors (p-FET's) used in contemporary DRAMs. This parasitic edge conduction is caused by electrons which become trapped at the nitride-oxide interface as a result of high-energy etching processes and, also, due to hot-carrier injection during normal operation. Thus, the nitride liner degrades performance of p-FETs as these hot carriers are injected into the edge area of nitride liner by the p-FET corner. Also, the nitride liner is recessed by pad nitride removal. The recess deepens the divot leading to problems such as reduced Vt and polysilicon stringers which short adjacent gates.

There is another disadvantage associated with annealing the oxide used to fill the shallow trench isolation (STI) device. Annealing is a costly and time-consuming step. The added cost of annealing is multiplied for some processes, for example, whereby a second oxide deposition is added to the STI after a first fill/anneal process sequence. The second oxide must also be annealed in a second annealing process if the device will be subsequently exposed to aqueous hydrofluoric acid (HF) because the aqueous HF will etch the un-annealed oxide at a higher rate than the annealed oxide, thus creating voids. If a second annealing operation is performed to anneal the new oxide film, the total annealing cost is doubled.

Another approach to minimizing the reduction in Vt due to leakage, is to form a spacer adjacent the shallow trench isolation film which extends above the substrate surface, so that the polysilicon gate does not extend over a sharp corner. This concept was discussed in U.S. Pat. No. 5,521,422, issued to Mandelman et al. If such a structure is to be produced by the current processing known in the art, then, a pad nitride pullback process step must be carried out first to provide a region adjacent to the STI structure over which the spacer can be formed. It must be sufficient to ensure that there is still STI filler material in the corner formed at the intersection of the STI structure and the substrate, after the initial (pad) oxide film is subsequently removed. If the STI used in this approach has a nitride liner, then the strip processes may additionally create a lateral void formed by the recession of nitride liner away from the corner. These voids or divots must be filled to avoid polysilicon shorts. The repeated use of nitride to re-fill the nitride liner recess leads to the p-FET problems discussed above. This pulled-back nitride STI structure is particularly difficult to form as the minimum lithography shrinks in size since the pad nitride film gets "pulled-back" to accommodate the spacers which are formed adjacent to the STI, and at the expense of active device area.

What is needed is a shallow trench process which does not produce an exposed nitride liner and which reduces parasitic corner conduction in surface channel MOSFETs by providing structures and processes which minimize divot formation. What is needed is a device wherein no portion of the nitride liner is present in the region of the sidewall which is prone to parasitic conduction in buried-channel p-FETs.

Furthermore, there is a need for a structure where the edge of the gate is displaced laterally away from the corner of the shallow trench isolation device, and which can be combined with a storage capacitor, especially one using a buried strap, to produce low leakage transistors due to the absence of any exposed nitride liners. There is also a particular need to produce low power merged logic-DRAM chips that have low leakage in both the array and the p-FET's.

In current nitride lined STI processes, a Catch-22 has been created. A large divot eliminates the leakage problems associated with trapped charge where the gate of a transistor steps over a corner exposing a nitride liner in the p-FET, but increases leakage in the array through the extra array dopant that is required to turn off the transistor because of the enhanced electric field created by the divot at the corner. As such, a shallow trench isolation device, which has corners which are substantially divot-free and do not include the nitride liner, is especially desirable.

SUMMARY OF THE INVENTION

To achieve these and other objects, and in view of its purposes, the present invention addresses the shortcomings of the shallow trench isolation processes and structures known to the prior art and provides an improvement to the current shallow trench isolation devices and processes. The present invention describes materials, processes, and structures used to produce low leakage transistors isolated by shallow trench isolation features which can simultaneously have a nitride liner that is isolated well away from the corner of the active area by an oxide filler, and is substantially divot-free.

In a preferred embodiment, the recessed nitride liner is covered or re-filled by an un-annealed oxide. In another preferred embodiment, the nitride liner is not needed because the main fill of the STI does not require annealing. In both of these embodiments, there is no nitride liner present in the corner of the device where it can contribute to charging in the p-FET, and there are substantially no divots present in the corners formed by the STI devices.

In an alternate embodiment, the nitride liner isolation also extends laterally away from the corner of the device over the active area due to pullback of the nitride film.

A feature of the present invention which enables the formation of the shallow trench isolation feature as described, is the use of an un-annealed dielectric as a trench filler material. The use of an un-annealed dielectric is enabled by yet another aspect of the present invention: The use of a gaseous mixture of hydrofluoric acid (HF)/ammonia (NH3) which provides an etchant species which etches an un-annealed dielectric film at a rate less than the rate at which it etches a thermally formed oxide film, because of the formation of a less permeable, diffusion limiting film on the surface being etched. This film controls the diffusion of the etchant species to the surface being etched. The hydrofluoric acid (HF)/ammonia (NH3) etch procedure is as described in U.S. Pat. No. 5,282,925 (issued to Jeng et al.) which discloses a method of stripping an oxide. Some benefits of the application of this hydrofluoric acid (HF)/ammonia (NH3) mixture in semiconductor processing were described in a co-pending application (Ser. No. 08/181,964) filed Oct. 29, 1998; now U.S. Pat. No. 6,127,215 Oct. 5, 2000 assigned to the present assignee.

The present invention provides processes for forming shallow trench isolation structures, with or without a recessed nitride liner, which are substantially divot free. An aspect of the present invention which allows for the production of this structure is the refilling of divots which may be created during processing. This process of refilling the divots may comprise adding an oxide film into the divots, and uniformly removing a sacrificial oxide film using a process which prevents or minimizes the formation of further divots.

The present invention also enables array leakage to be optimized by reducing the required array threshold voltage implant so that the combination of buried strap and subthreshold leakage is minimized.

BRIEF DESCRIPTION OF THE DRAWING

The present invention is best understood from the following detailed description when read in connection with accompanying drawing. It is emphasized that, according to common practice, the various features of the drawing are not to scale. On the contrary, the dimensions of the various features are arbitrary expanded or reduced for clarity. Included in the drawing are the following figures.

FIG. 1A is a cross-sectional view of an alternate embodiment showing pull-back of the nitride film;

DETAILED DESCRIPTION OF THE INVENTION

Figure 1:
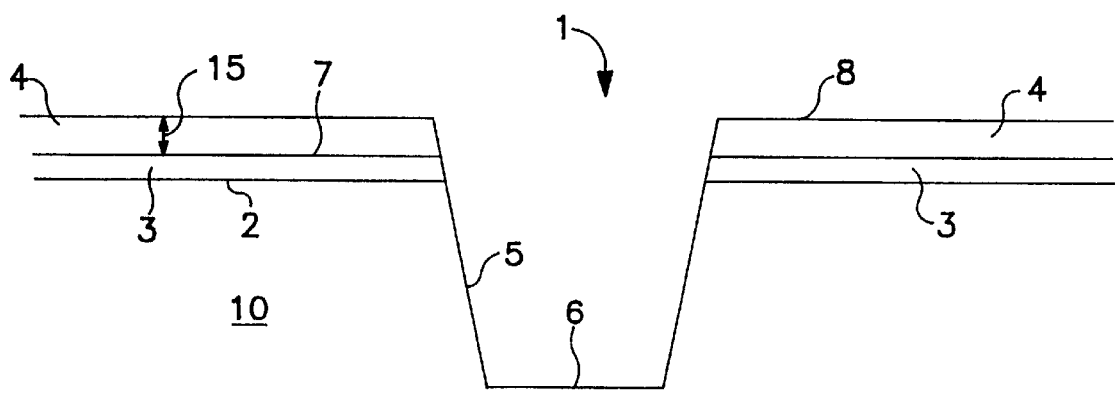
FIG. 1 is a cross-sectional view of a trench formed within a semiconductor substrate.

The structure and processes of the present invention can be best described in conjunction with the drawing. The following features highlight the advantages of the present invention:

1. Utilizing an un-annealed dielectric film as a filler material in a shallow trench isolation structure.

2. Substantially eliminating a divot at the edge of a shallow trench isolation device, which allows for a reduction in the required array dopant.

3. Eliminating the nitride liner in the corner of the shallow trench isolation device by recessing it or eliminating it entirely.

4. "Pulling back" the nitride film so as to minimize edge effects at the intersection of the shallow trench isolation device and the device substrate.

5. Utilizing a gaseous mixture of hydrofluoric acid and ammonia to remove oxide films, without overetching the un-annealed film so as to cause divots.

Feature 1, the use of an un-annealed oxide as a filler material in the STI, comprises a new structure and is the feature that is common throughout the present invention. The formation of a substantially divot-free shallow trench isolation device is another feature common throughout the present invention.

In one exemplary embodiment, the shallow trench isolation device is formed virtually divot-free. In an alternate exemplary embodiment, a divot is formed due to the intentional recessing of a nitride liner. In this embodiment, the divot is refilled and the intersection between the shallow trench isolation device and the substrate surface is substantially continuous and divot-free. Another feature common throughout the invention is the absence of a nitride film at the intersection of the shallow trench isolation structure and the substrate surface. In the embodiment which utilizes a nitride film as a trench liner, the nitride film is recessed from the corner as it is isolated from the corner by an oxide film. The above features of the present invention offer the following advantages:

1. Since an annealing process is not required, fewer defects are produced in the shallow trench and deep trench collar.

2. The process window between sub-threshold leakage caused by low Vt or too little array implant, and buried strap leakage caused by too much array implant, is widened because the Vt implant does not require adjustment to compensate for the presence of nitride at the corner of a shallow trench device or for divots formed at the corner.

3. The p-FET, "corner-off" current, induced by hot electron trapping by a nitride liner at the corner, is eliminated by eliminating the nitride liner especially at the device corner.

The structures of the invention are enabled by another feature of the present invention: the use of a gaseous mixture of ammonia and HF to etch the unannealed dielectric film. A key feature of this process is that an intermediate reaction product forms on the surface which results in a lowered etch rate for an unannealed dielectric film such as tetraethyl orthosilicate (TEOS). Using this gaseous mixture, an unannealed TEOS film has an etch rate less than that of both an annealed TEOS film and a thermal oxide film. In the prior art, an unannealed film would etch must faster than an annealed film, making the unannealed film less desirable in this application. Using the present invention, an un-annealed dielectric film, such as TEOS, is now the preferred filler dielectric for shallow trench isolation structures, because it may eliminate the defects associated with the annealing process.

The shallow trench isolation structures of the present invention find particular usefulness in DRAM structures which utilize buried strap devices to connect to deep trench capacitors. In trench-based 0.25 $\mu$m DRAM chips, for instance, the deep trench capacitor of the memory bit contacts the active p-type silicon in which the capacitor resides by a structure known as a "buried strap." The buried strap is formed by depositing silicon (undoped or n-doped) in the deep trench, typically as amorphous silicon. After formation of the storage trench capacitor, buried strap and recess, the STI is formed.

The bulk of the trench capacitor is filled with n-type silicon which serves as a capacitor electrode. Since the strap forms an electrical connection to the active silicon mesa, there exists an n-p junction between the strap and the active silicon mesa. The leakage from the buried strap junction has been found to be one of the principal sources of bit failures in the trench-based DRAM chips.

The buried strap junction leakage is also modulated by the p-type concentration in and around the buried strap region. One process that has been found to influence the leakage of the buried strap is the array threshold implant—more commonly known as the Vt adjust implant—which is used in forming the surface channel transistor and which also controls the passage of charge into the deep trench capacitor. This implant controls the on-state and off-state characteristics of the array transistor. In 0.25 $\mu$m trench-based DRAM, the array transistor is an n-type transistor—thus, the Vt adjust implant is one that is p-type (typically boron) and should reside close to the surface of the device (i.e. around the depth of the buried strap). It has been observed that the off-state leakage of the array transistor is highly dependent on the amount of boron implanted for the surface channel device. Too little boron will enhance "off-state" leakage (i.e. sub-threshold leakage) of the array device. Increasing the surface boron concentration, however, will enhance the previously mentioned buried strap junction leakage. Thus, it may be necessary to balance the amount of surface boron that will create an array transistor that has "good" off-state leakage while simultaneously minimizing the leakage from the buried strap. Sub-threshold leakage of the array device is also tied to the physical structure of the device at steps and corners where the device adjoins the shallow trench isolation features.

EXEMPLARY EMBODIMENT #1

Now referring to the drawing, FIG. 1 shows a trench 1 formed within a semiconductor device. An oxide film 3 is formed on the initial substrate surface 2 of semiconductor substrate 10. The oxide film 3 is thermally grown. In a preferred embodiment the oxide film thickness may be on the order of 30 to 50 angstroms. On the top surface 7 of the oxide film 3, a nitride film 4 is formed. The nitride film 4 which includes a top surface 8 and a thickness 15, may be formed using an LPCVD (low pressure chemical vapor deposition) process, or any other suitable process known to the art. A trench 1 is formed by using a photolithographic procedure, for example, to first define the shallow trench isolation area. After the lithographic pattern (not shown) has been made to define the shallow trench isolation device, the nitride film 4, and the oxide film 3, are then etched using any etch procedure suitable in the art. In the preferred embodiment, a succession of Reactive Ion Etch (RIE) plasma etch processes may be used. Then the trench formation continues as the trench is etched into the semiconductor substrate 10, which may be silicon in a preferred embodiment. Any method for etching silicon suitable to the art, may be used to form the trench. In the preferred embodiment, RIE etching may be used. The trench 1, as formed, extends through the silicon nitride film 4 and through the oxide film 3 and extends down into the semiconductor substrate 10, and includes sidewalls 5 and a trench bottom 6.

FIG. 1A shows an alternate embodiment of the present invention using a "pull-back" of the silicon nitride film 4. In FIG. 1A, the nitride film 4 is "pulled-back" from the regions 60 adjacent to the trench 1. The nitride film 4 is etched using any procedure suitable in the art. In a preferred embodiment, hot phosphoric acid at 160–165° C. may be used. After the nitride film 4 is etched, or pulled back as shown in FIG. 1A, a region 60 is formed adjacent to the shallow trench 1 which is void of the silicon nitride film 4. Also, as the silicon nitride film 4 is being "pulled-back", the thickness of the film is being decreased so that film thickness 61 is less than original film thickness 15 (as shown in FIG. 1). The effect of "pulling-back" the silicon nitride film 4 prior to filling the trench 1 is to enable an active area with a corner which will be filled in the subsequent trench fill process.

Figure 2:
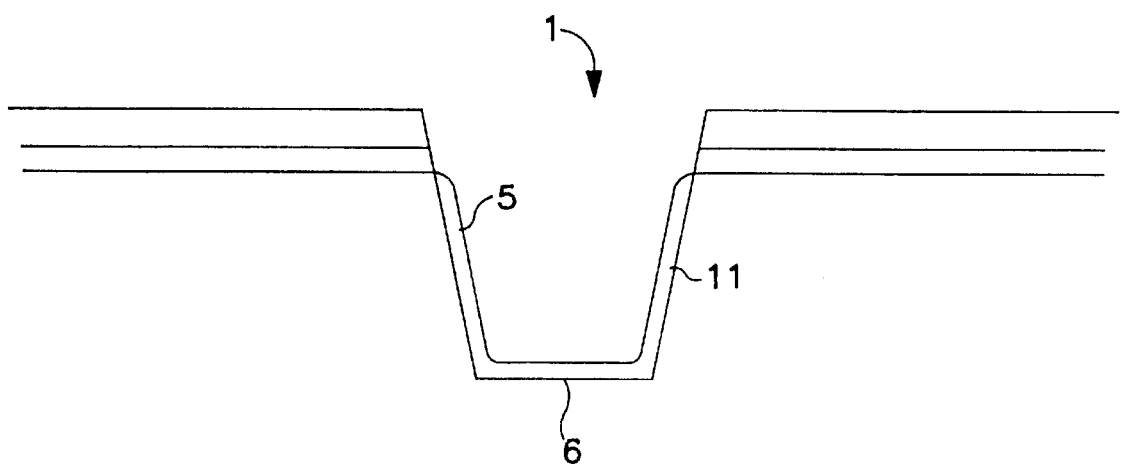
FIG. 2 is a cross-sectional view showing an oxide liner formed within the trench.

FIG. 2 represents the embodiment depicted in FIG. 1 after the next step in the process. FIG. 2 shows the shallow trench isolation structure after a thermal oxide liner 11 has been formed along the sidewalls 5 and trench bottom 6. In a preferred embodiment, the thickness of the oxide liner film 11 may be on the order of 100 to 200 angstroms.

Figure 3:
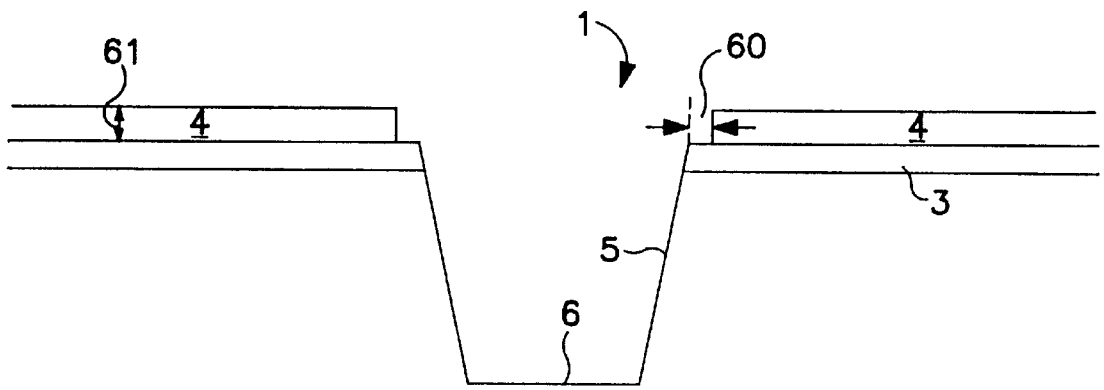
FIG. 3 is a cross-sectional view of the trench after it has been filled with a dielectric.
Figure 3:
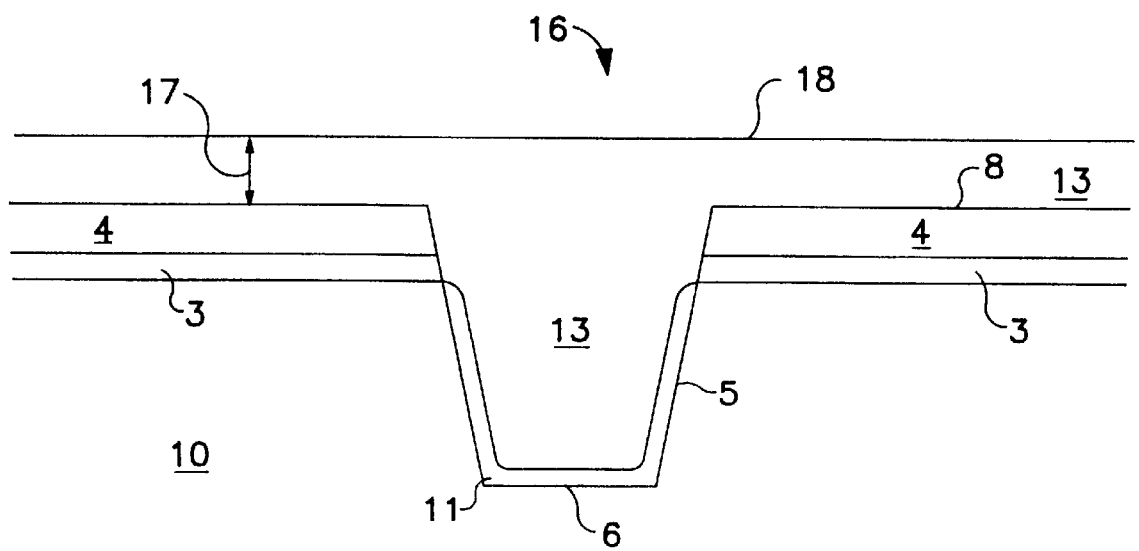

In FIG. 3, dielectric material 13 covers the top surface 8 of silicon nitride film 4 and fills the trench 1 formed within substrate 10. The top surface 18 of the dielectric material 13 extends above the top surface 8 of the nitride film 4 by a distance 17. In a preferred embodiment, the dielectric material 13 may be a TEOS film. Also in the preferred embodiment the process for depositing the TEOS film may be a low pressure chemical vapor deposition (LPCVD) process. Shallow trench isolation (STI) structure 16 is now formed within trench 1.

Figure 4:
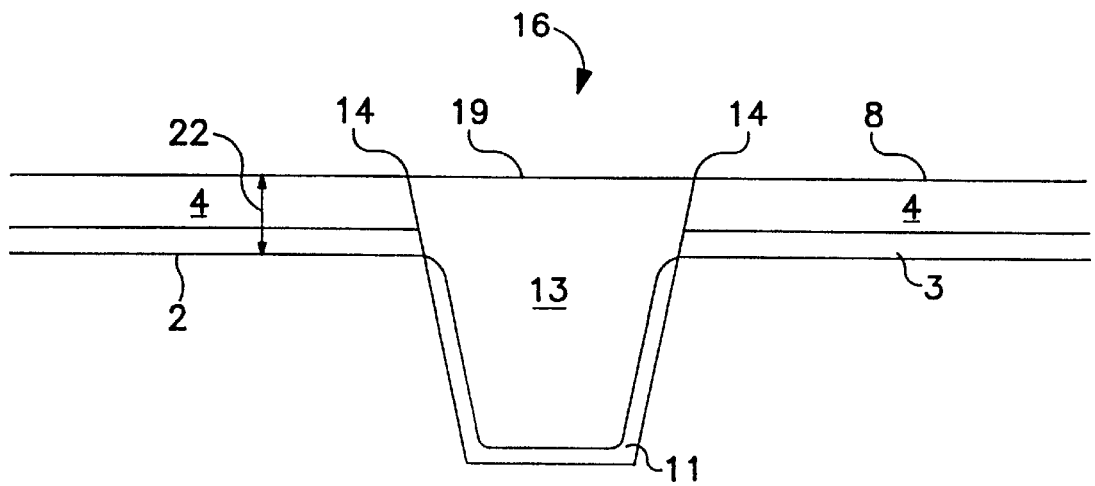
FIG. 4 is a cross-sectional view of the trench after planarization.

FIG. 4 shows the STI structure 16 after the structure has been planarized. The dielectric film 13 is substantially removed in regions over the silicon nitride film 4 to expose top surface 8 of the silicon nitride film 4 and produce top surface 19 of the dielectric film 13 which is now substantially coplanar with the top surface 8 of the silicon nitride film 4, as the original top surface 18 (shown in FIG. 3) is recessed. In a preferred embodiment, chemical mechanical polishing (CMP) may be used to planarize the structure. As can be seen, the dielectric material 13 which forms the shallow trench isolation device 16 has a top surface 19 which extends above the surface 2 of the original silicon substrate, by a distance 22. The intersections 14 between the shallow trench isolation device 16 and the nitride film 4 comprise a relatively smooth surface.

Figure 5:
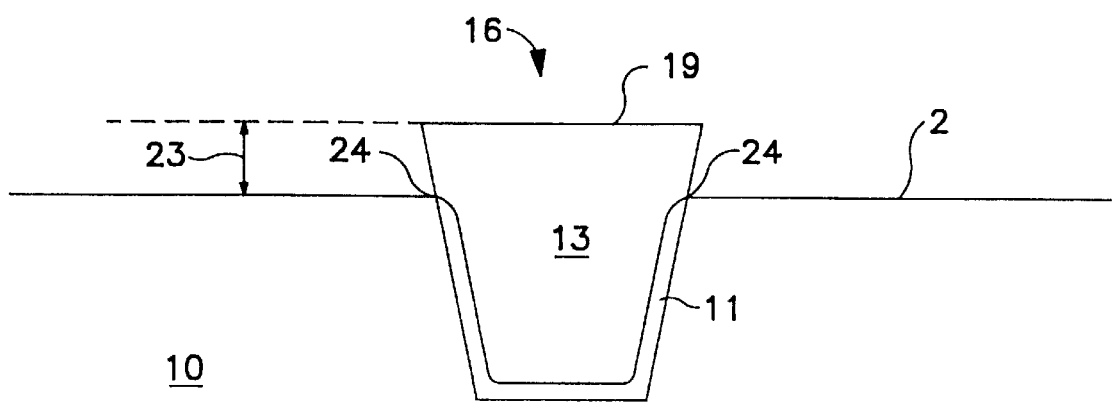
FIG. 5 is a cross-sectional view of the trench after nitride and oxide films have been removed.

FIG. 5 shows the shallow trench isolation structure 16 after both the silicon nitride film 4 (shown in FIG. 4) and the oxide film 3 have been removed. The silicon nitride film 4 may be removed using any procedure suitable in the art, such as by etching the film in hot phosphoric acid at 160–165° C. After the removal of the silicon nitride film 4, the oxide film 3 is subsequently removed.

The oxide film 3 may be removed, in the preferred embodiment, by etching the film in a gaseous mixture of two parts hydrofluoric acid and one part ammonia at a pressure of 7 to 8.5 millitorr using a batch reactor. The typical etch time associated with removing an oxide film on the order of 30–50 angstroms, may be 3–10 minutes. The etch time may vary based on the size of the batch reactor used and the number of semiconductor devices being simultaneously etched in the reaction chamber. The etching process uses a purely gaseous neutral mixture and does not employ reactive ion etching. In this manner, the oxide film 3 may be removed to expose the original silicon substrate 2, without creating divots at the intersection 24 of the shallow trench isolation device and the substrate surface 2. As the oxide film 3 is removed to expose the silicon substrate 2, the top surface 19 of the shallow trench isolation device 16 is also recessed at approximately the same rate (as below).

Note that the top surface 19 of the shallow trench isolation device 16 extends above the original silicon substrate 2 by a distance 23, which may be less than distance 22 as shown in FIG. 4, since the top surface 19 is also recessed during etching as above. In the preferred embodiment, distance 23 is chosen such that the top surface 19 will be nearly planar with substrate surface 2 after subsequent oxide etches have been completed.

Using the etch procedure described above to etch the structure of the present invention, the etch rate of an unannealed TEOS film is less than that for a thermal oxide film, and an annealed TEOS film. The etch procedure as described in U.S. Pat. No. 5,282,925 (issued to Jeng et al.) discloses a method of stripping oxide by means of reacting HF with the oxide in a vacuum ambient to form $SIF_4$ and then reacting the $SiF_4$ with $NH_3$ to form ammonia hexafluorosilicate, $(NH_4)_2SiF_6$. The ammonia hexafluorosilicate remains on the surface being etched so that the reaction is self-limiting. Because of this phenomena, the etch rate of unannealed TEOS film is less than that for a thermally grown oxide film, and also less than that for an annealed TEOS film. As such, it can be used to simultaneously etch a thermal oxide film and an unannealed TEOS film without overetching the unannealed TEOS film and thereby creating divots, enabling the present invention.

Figure 6:
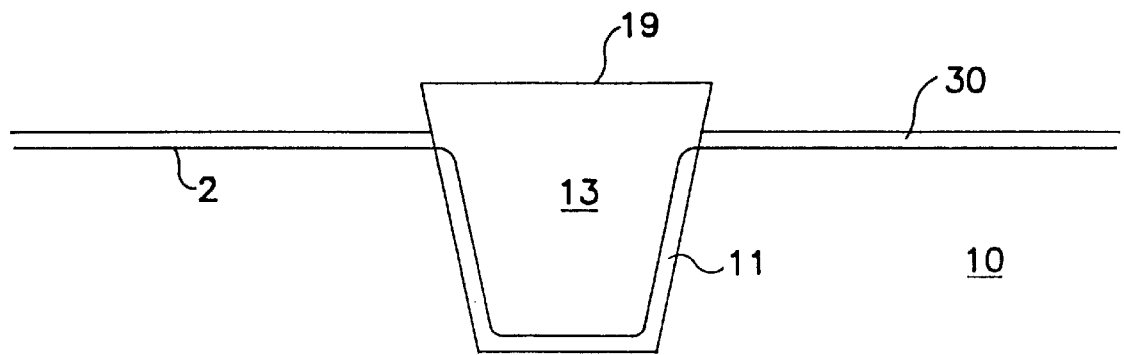
FIG. 6 is a cross-sectional view of the trench after sacrificial oxide growth.

FIG. 6 shows the shallow trench isolation (STI) structure after a thin sacrificial oxide film 30 has been thermally grown on the surface 2 of substrate 10. In the preferred embodiment, the thickness of the sacrificial oxide film 30 may be 60–70 Angstroms on surface 2. The sacrificial oxide film 30 is added to promote uniformity within the surface 2 of the substrate 10.

Figure 7:
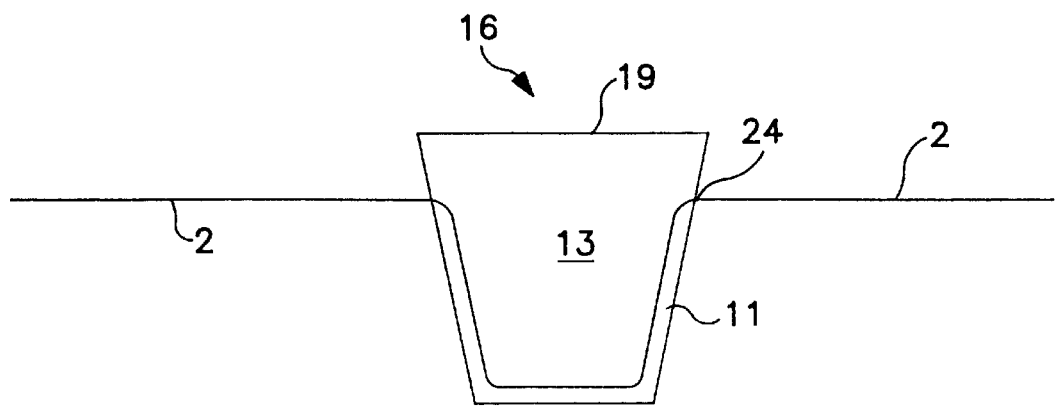
FIG. 7 is a cross-sectional view of an exemplary embodiment of the shallow trench isolation device.

FIG. 7 shows the STI structure after the thin sacrificial oxide film has been removed to produce the substantially divot free shallow trench isolation device 16 of the first exemplary embodiment of the present invention. In the preferred embodiment, the gaseous mixture of two parts hydrofluoric acid and one part ammonia at a pressure of 7 to 8.5 millitorr using a batch reactor may be used. The STI structure 16 includes a top surface 19 and divot-free corners 24, where the isolation device 16 intersects surface 2.

EXEMPLARY EMBODIMENT #2

In an alternate embodiment of the present invention, using a nitride liner which is introduced into the trench and later recessed, FIG. 8 continues the processing sequence showing this alternate embodiment of the present invention with the step in the process sequence which follows FIG. 2. (FIGS. 1 and 2 depict the initial processing steps common to the STI structure in multiple embodiments.) As with the previous exemplary embodiment, the nitride "pull-back" procedure as in FIG. 1A may be used before the step in the process sequence depicted in FIG. 8.

Figure 8:
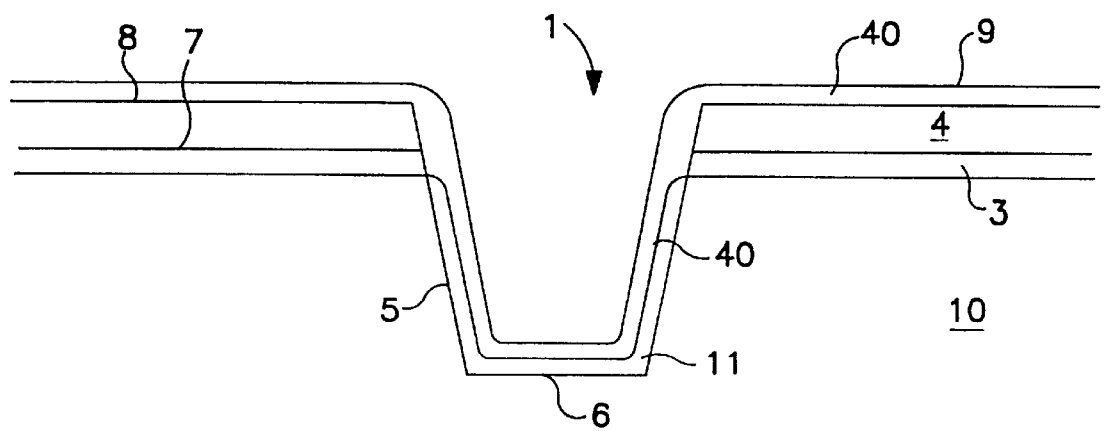
FIG. 8 is a cross-sectional view of an alternate exemplary embodiment including a nitride liner formed within the trench.

In FIG. 8, a thin silicon nitride film 40 is formed over the structure. Thin silicon nitride film 40 covers both the top surface 8 of the silicon nitride film 4 and fills the trench 1 along the trench walls 5 and the trench bottom 6, covering the thin thermal oxide film 11. In a preferred embodiment, 50–60 angstroms of a silicon nitride film deposited by LPCVD may be used. As obvious to one skilled in the art, however, other suitable methods for depositing a thin silicon nitride film may be used. The thin silicon nitride film 40 has a top surface 9.

Figure 9:
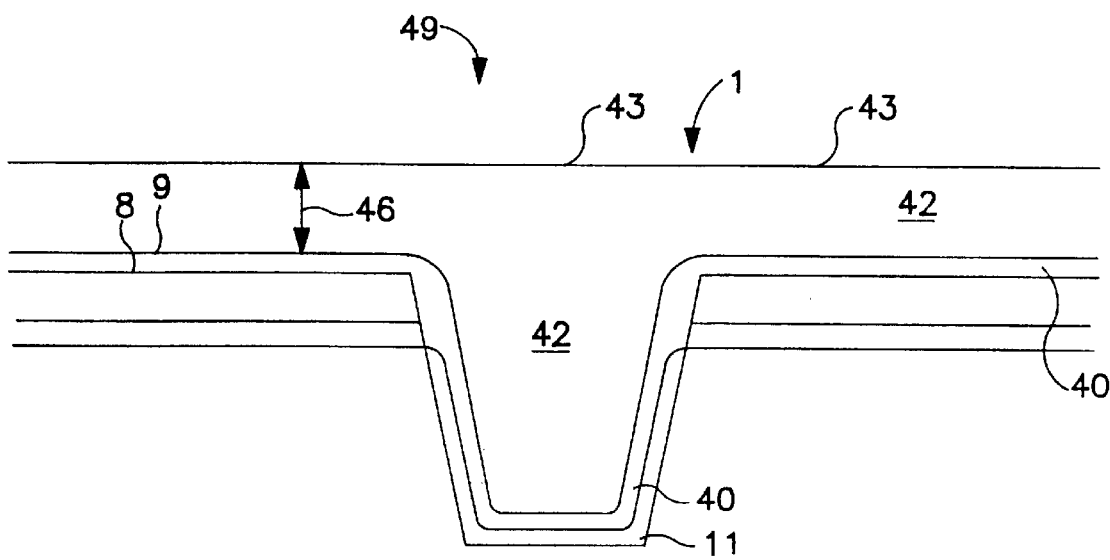
FIG. 9 is a cross-sectional view of the alternate exemplary embodiment after dielectric film deposition.

FIG. 9 shows the following step in the process. A dielectric film 42, which may be a TEOS film in the preferred embodiment, is deposited over the top surface 9 of silicon nitride film 40, and also within the trench 1 to form shallow trench isolation structure 49. The top surface 43 of the TEOS film 42 extends above the top surface 9 of the underlying substrate, which is now the top surface 9 of the thin silicon nitride film 40, by distance 46.

Figure 10:
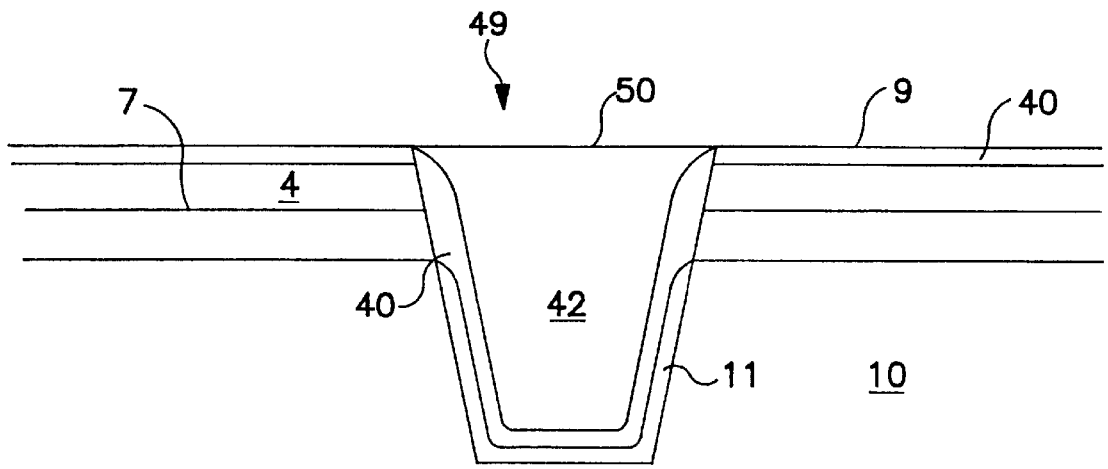
FIG. 10 is a cross-sectional view of the alternate exemplary embodiment after planarization.

FIG. 10 shows the shallow trench structure 49 after it has been planarized. In the preferred embodiment, chemical mechanical polishing may be used. Original top surface 43 of FIG. 9 has been recessed to top surface 50 of the dielectric film 42, which is now substantially co-planar with a top surface 9 of the silicon nitride film 40. The silicon nitride film 40 is also exposed during the planarization process as the portion of dielectric film 42 which previously covered the top surface 9 of the nitride film, is substantially removed during this process.

Figure 11:
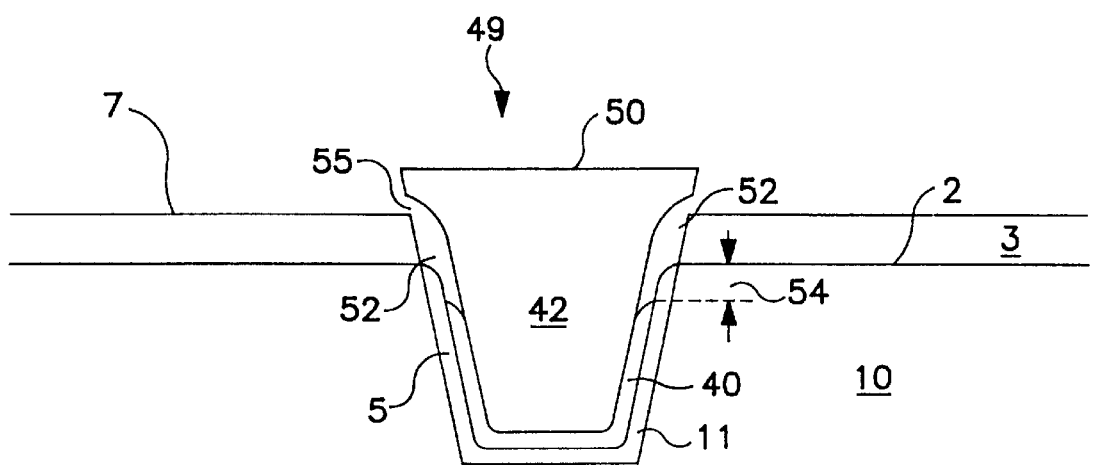
FIG. 11 is a cross-sectional view of the alternate exemplary embodiment showing divots created above the nitride liner.

FIG. 11 shows the shallow trench structure 49 after the silicon nitride films (including silicon nitride films 4 and 40 as shown in FIG. 8) have been removed. In a preferred embodiment, hot phosphoric acid at 160–165° C. may be used to remove the silicon nitride films. As the silicon nitride film is being removed, a divot 52 is forming at the corner 55 of the trench structure 49. A portion of the silicon nitride liner film 40 which had been lining the sidewall of the trench 5 is removed from the corner 55, at the point where it intersects silicon nitride films 40 and 4. The divot 52 is created at the expense of the silicon nitride film 40 which is recessed below corner 55. The nitride film 40 along the sidewall 5 is recessed below the surface 2 of the original silicon substrate by a distance 54. This distance of recess is critical, since it is necessary to remove the nitride from the corners 52, while controlling the size of the divots 52 such that they can subsequently be filled, as will be seen in the subsequent figures. After oxide film 3 is removed later in the process, the divot 52 will be refilled with an oxide film, maintaining the recession of nitride film 40 from the corner 55 while filling in the divot 52. This recessed feature of the nitride liner is critical for reducing hot carrier leakage. As the nitride films 4 and 40 are removed by hot phosphoric acid, overetch intentionally and controllably recesses the nitride liner from corner 55 so that it does not degrade the buried channel p-FET transistors in the silicon sidewall region by remaining at corner 55.

Figure 12A:
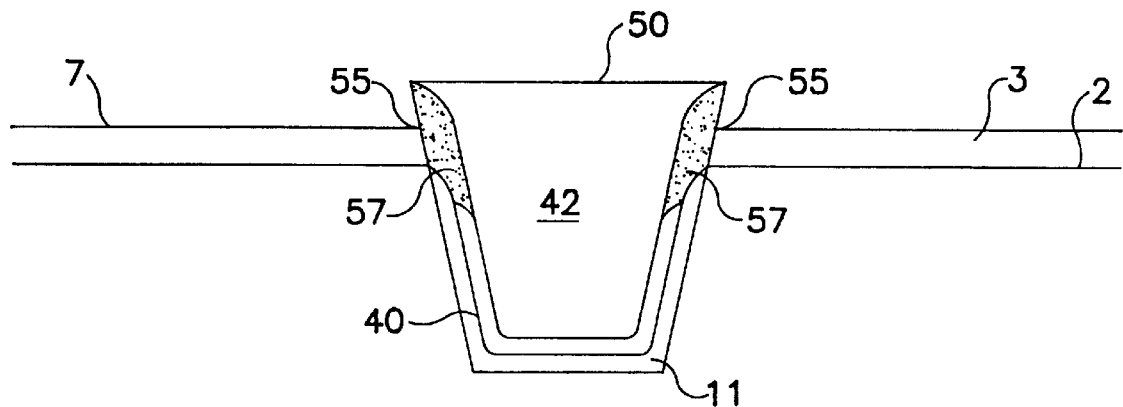
FIG. 12A is a cross-sectional view of the alternate exemplary embodiment showing the filled divots.
Figure 12B:
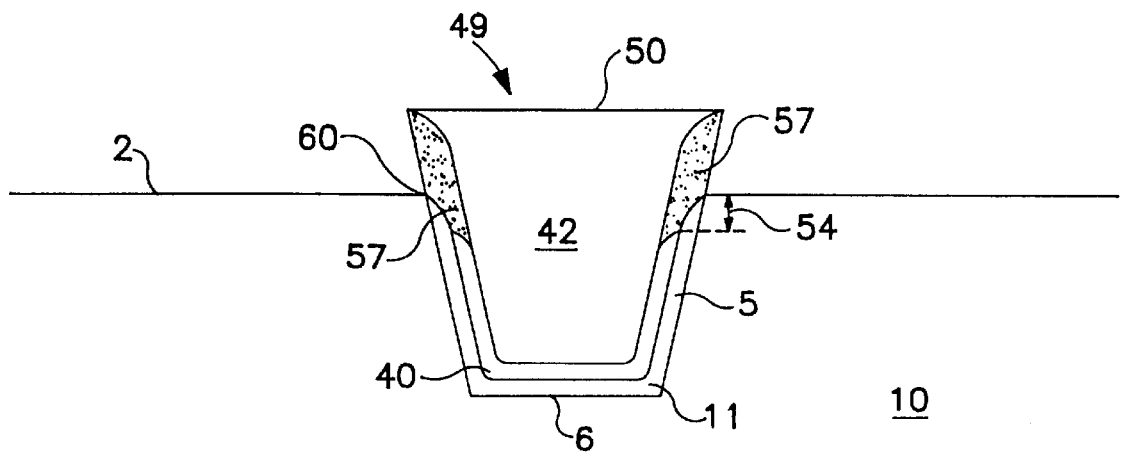
FIG. 12B is a cross-sectional view of the alternate exemplary embodiment of a shallow trench isolation device of the present invention.

The divot 52, thus created, may be substantially filled using the process shown in FIGS. 12A and 12B in an alternate exemplary embodiment, or as in FIGS. 13A–13D in another alternate exemplary embodiment.

In FIG. 12A, this divot (feature 52 of FIG. 11), thus created, is then substantially filled with a plug 57, which may be an oxide filler. To fill the divot and create plug 57, a number of oxide deposition processes suitable to the art may be used. In a preferred embodiment, the oxide deposition process may be LPTEOS (low pressure TEOS deposition). In another exemplary embodiment, Ozone-assisted chemical deposition of the TEOS film may be used.

In another exemplary embodiment, a thin layer of polysilicon may be deposited to partially fill the divot (feature 52 of FIG. 11). Subsequent to the deposition of the polysilicon film, the structure is thermally oxidized to oxidize the polysilicon film in the original divot. The oxide film formed is thicker than the original polysilicon film, and fills the divot. For example, for a recess 60 angstroms wide, 20 angstroms of a conformal polysilicon film is deposited on each side of the recess. The formed oxide fills the remaining 20 angstroms of the recess, thereby substantially filling the divot. In yet another alternate embodiment, a gaseous mixture of HF/ammonia mixture may be used to deepen and widen (etch) the divot prior to the deposition of the oxide film which will be used as a filler. The decision as to deepen and widen the divot will be made based upon the oxide deposition process which will be used to subsequently fill the divot. As the oxide film is formed to fill the divot, a sacrificial oxide film (not shown) will also form over the STI device and will add to the thermal oxide film 3.

FIG. 12B shows the completed shallow trench isolation device 49 after oxide film 3 and any additional oxide film formed during the divot fill process, have been removed down to the original substrate surface 2. To remove the oxide films, an HF/ammonia gaseous mixture at 7–8.5 millitorr pressure is used which removes the oxide film 3 and any sacrificial oxide. The top surface 50 of the STI, is also recessed by an amount approximately equal to the original thickness of the thermal oxide film 3. In an alternate embodiment, the oxide etch may be overextended after the oxide film 3 and any sacrificial oxides have been removed. In this manner, the top surface 50 may be further recessed down to the level of the original substrate surface 2.

As depicted, the completed shallow trench isolation device 49 includes a trench defined by sidewalls 5 and trench bottom 6 formed within a silicon substrate 10 which has a top surface 2. The shallow trench isolation feature includes a thin oxide liner 11. Also included is a thin film of silicon nitride 40. This silicon nitride film is recessed by an amount 54 from the top surface 2 of the original silicon substrate. This recessed area has been filled with a filler film 57 which is an oxide. The STI structure 49 includes a top surface 50 and substantially divot-free corners formed at the intersection 60 of the STI structure 49 and the substrate surface 2. Plugs 57, consisting of an oxide, provide for a continuous surface at the intersection 60.

EXEMPLARY EMBODIMENT #3

Figure 13A:
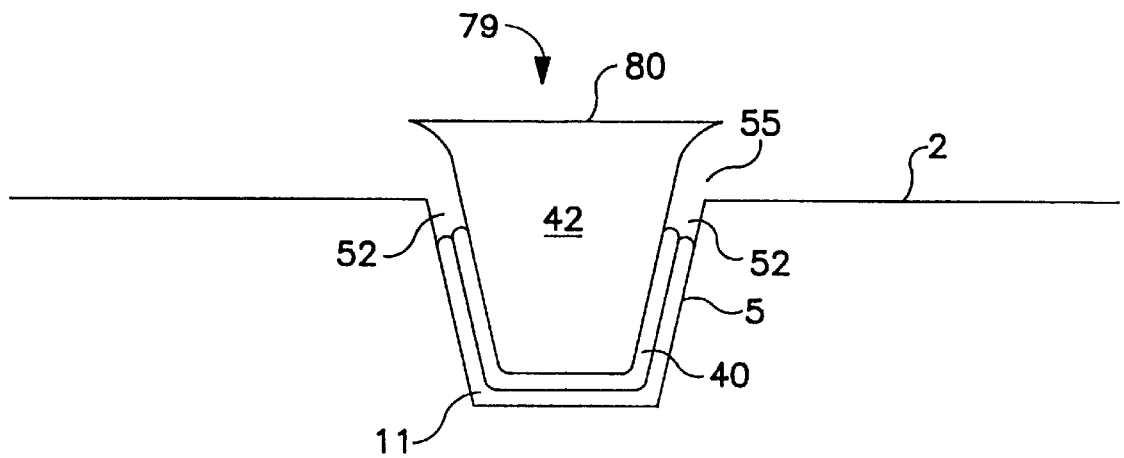
FIG. 13A is a cross-sectional view of another exemplary embodiment of the present invention showing divots created.

In another exemplary embodiment, the divot may be substantially refilled with an oxide film after removal of the original oxide film 3. FIG. 13A represents the step in the process which follows FIG. 11 for this alternative embodiment. FIG. 13A shows the STI structure 79 after the oxide film 3 (FIG. 11) has been removed to expose substrate surface 2. The nitride film 40 is recessed from corner 55 as in the previous exemplary embodiments. The method for removal of the oxide film may be achieved by using the gaseous mixture of hydrofluoric acid and ammonia as described above. In this embodiment, the divot 52 becomes enlarged as the oxide film 3 is removed because parts of the oxide liner 11 and dielectric film 42 may be removed during the oxide removal step. The previous top surface 50 as shown in FIG. 11 is also recessed during the oxide removal step to produce top surface 80.

Figure 13B:
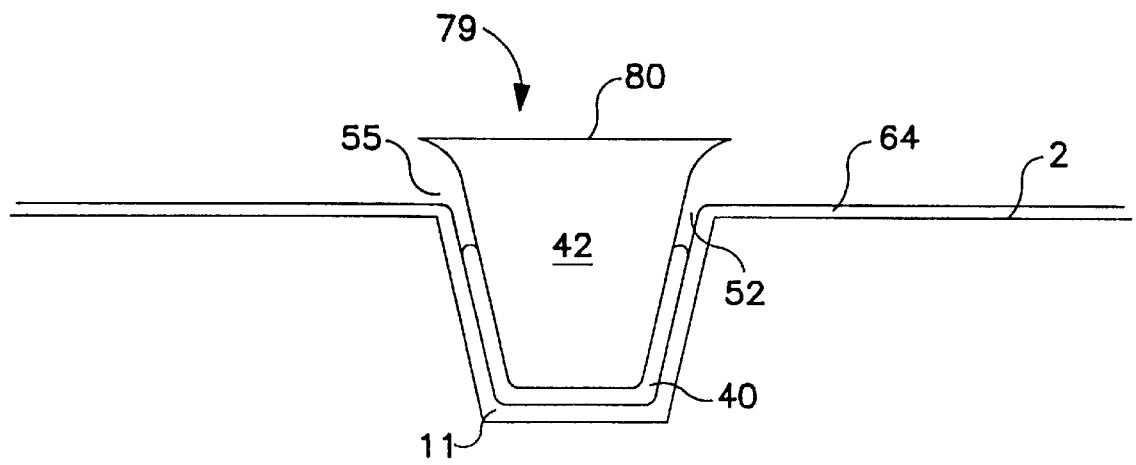
FIG. 13B is a cross-sectional view of another exemplary embodiment of the present invention after removing an oxide film.

FIG. 13B shows the STI structure 79 following the addition of a thermally grown sacrificial oxide film 64 formed on surface 2, and also formed within the divot 52.

Figure 13C:
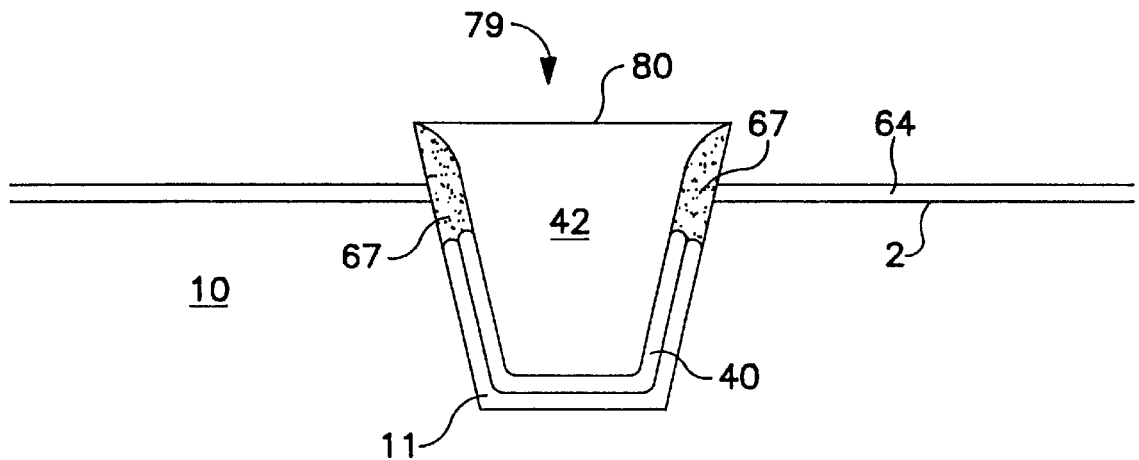
FIG. 13C is a cross-sectional view of another exemplary embodiment of the present invention after the divots have been filled.

FIG. 13C shows this exemplary embodiment after divot 52 has been filled with an oxide plug 67. The method for substantially filling the divot 52 with an oxide may be as described in conjunction with FIG. 12A of the previous exemplary embodiment.

Figure 13D:
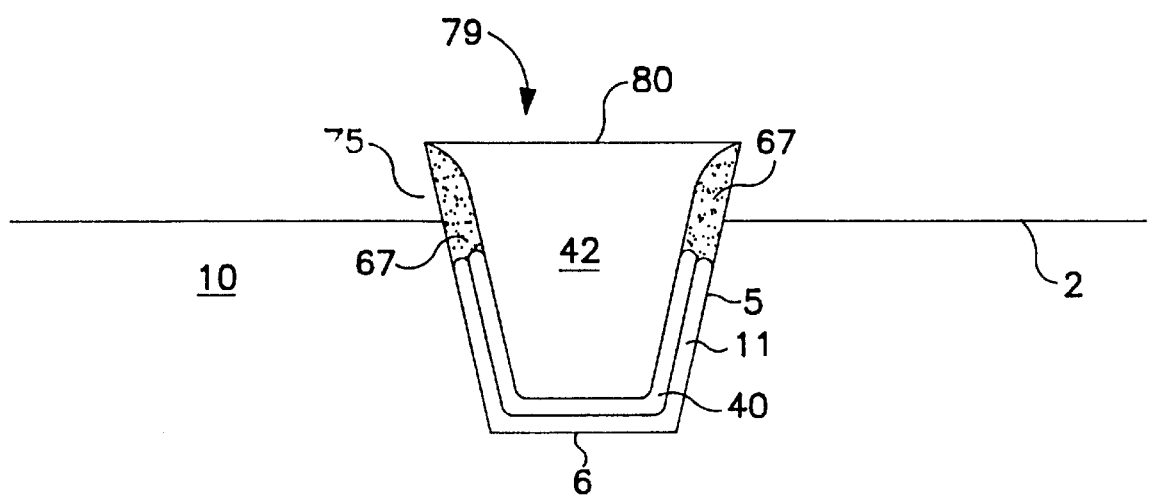
FIG. 13D is a cross-sectional view of another exemplary embodiment of the present invention.

FIG. 13D shows the completed STI structure 79 of this alternative exemplary embodiment after sacrificial oxide film 64 has been removed. The method for removal of the sacrificial oxide film 64, as shown in FIG. 13C, may include using the gaseous mixture of hydrofluoric acid and ammonia as described previously in association with previous oxide removal processing steps. As shown, the completed shallow trench isolation device 79 includes a trench defined by sidewalls 5 and trench bottom 6 formed within a silicon substrate 10 which has a top surface 2. STI device 79 includes a top surface 80, and divot-free corners formed at the intersection 75 of the STI structure 79 and substrate surface 2. Plugs 67 consisting of an oxide, provide a substantially continuous surface at the intersection 75. As discussed in conjunction with FIG. 12D, the oxide etch may be extended to further recess the top surface 80 down to the substrate surface 2, in an alternative embodiment.

DEVICE APPLICATION

Figure 14A:
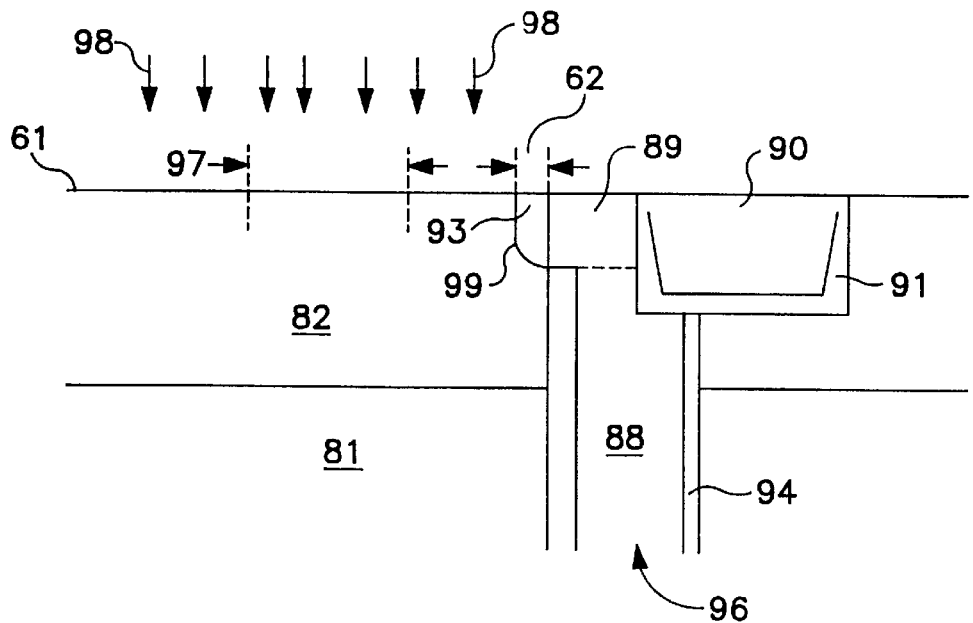
FIG. 14A is a cross-sectional view of an exemplary embodiment of the present invention incorporated into a DRAM structure.
Figure 14B:
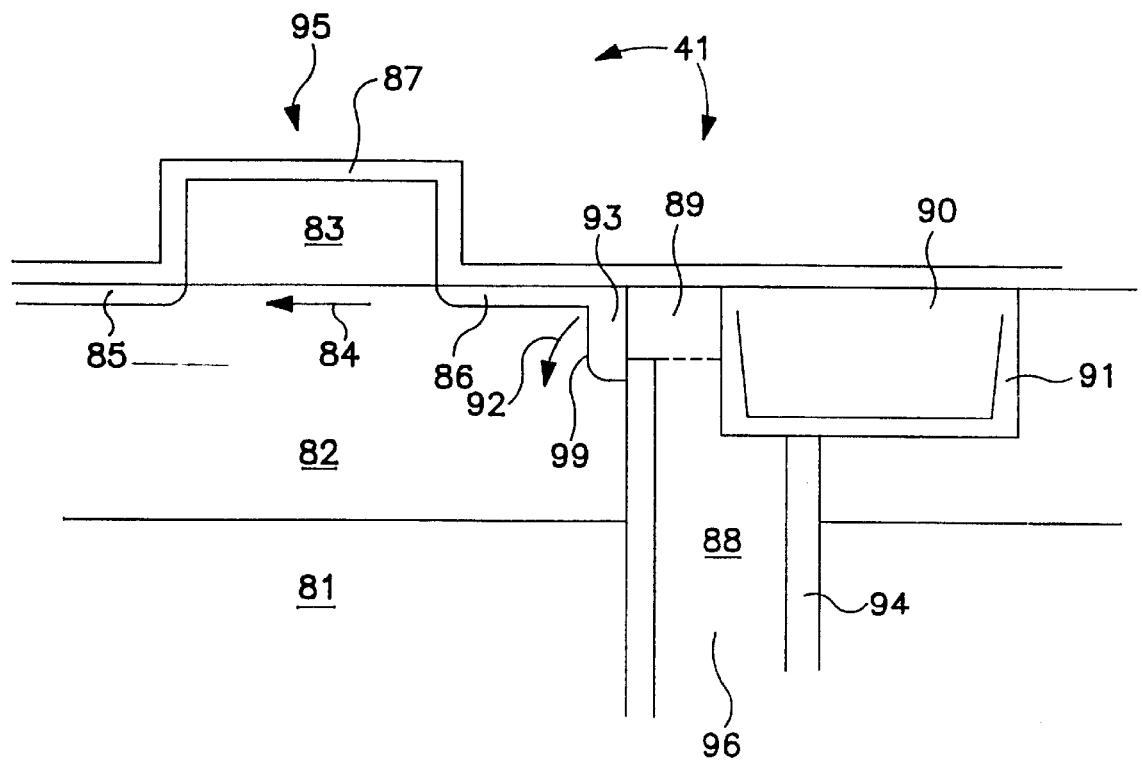
FIG. 14B is a cross-sectional view of an exemplary embodiment of the present invention incorporated into a completed DRAM device.

The isolation structures described above can be incorporated in a storage trench DRAM circuit with a buried strap as shown in FIGS. 14A and 14B. The combination of buried strap and sub-threshold leakage is minimized by adjusting the array threshold implant. The reduced divot of the shallow trench isolation structures of the present invention relative to prior art structures, enables a reduced array implant and therefore a reduction in the combination of buried strap and sub-threshold leakage in the DRAM array.

The elimination of the nitride liner from the sidewall of the trench of the claimed structure reduces the parasitic edge conduction in the buried channel P-FET. Thus, low leakage array and support transistors are simultaneously obtained.

FIG. 14A shows the shallow trench isolation (STI) device 90 of the current invention incorporated into a DRAM device. The STI structure 90 includes a recessed nitride liner 91. In this exemplary embodiment of the present invention, the STI structure 90 is not formed solely within the undoped semiconductor substrate 81 (as in the previous embodiments), nor solely within the doped P-well region 82 formed within the semiconductor substrate. Rather, the STI structure 90 is formed partially within the P-well region 82, and also partially within a trench capacitor 96 formed within the substrate 81 prior to the formation of the shallow trench isolation structure 90 of the present invention. The trench capacitor 96 includes an N-doped polysilicon fill material 88 and a collar oxide 94 for isolating the doped polysilicon 88 from the substrate. The upper section of the polysilicon film material 88 includes a buried strap region 89. The buried strap region 89 together with an out-diffused buried strap region 93 will provide an electrical connection between the N-type doped polysilicon film material 88 and an active area of a transistor device (as will be seen in FIG. 14B). A junction 99 is formed between the N-typed buried strap region 93, and the P-well region 82.

Array threshold implant 98 is introduced into the top surface 61 of the structure. Any ion implantation procedure suitable in the art may be used to introduce a P-type dopant into the structure. In a preferred embodiment, the array threshold implant is comprised of boron. The array threshold implant 98 controls threshold voltage of the N-type transistor as well as sub-threshold leakage. The array threshold implant 98 is introduced into the substrate in region 97 which will later be covered by a polysilicon gate of a DRAM transistor (as will be seen in FIG. 14B); the implanted impurity enters the substrate in region 62 where it causes buried strap leakage, and it also enters the substrate in regions (not shown) which will become active areas of the transistor devices.

FIG. 14B shows the DRAM device 41 after it has been completed. The completed device 41 includes the features as discussed in conjunction with FIG. 14A and also includes source/drain regions 85 and 86 of an N-type transistor 95. The transistor 95 also includes gate 83. Source/drain regions 85 and 86 are the active areas of transistor 95 and may be formed by any method suitable in the art such as by source/drain ion implantation. The source/drain region are formed of N-type dopant impurities. Likewise, transistor gate 83 may be formed by any method suitable in the art. In an exemplary embodiment, transistor gate 83 is comprised of polysilicon which may be deposited using an LPCVD (low pressure chemical vapor deposition) process. The completed structure also includes a nitride liner 87 covering the upper surface of the structure. As a result of different dopant impurities introduced into adjacent features of the device, and different materials used to form the device, a number of leakages associated with the structure have been observed. Arrow 84 represents the sub-threshold leakage path associated with the transistor device. Arrow 92 represents buried strap junction leakage. This leakage, as indicated by arrow 92, occurs at the p-n junction 99 created at the interface between the p-well region 82, and the N-type doped buried strap region 93. Because of the incorporation of the shallow trench isolation device 90 of the present invention, the array threshold implant (feature 98 of FIG. 14A), can be adjusted to minimize the combination of buried strap leakage (arrow 92) and sub-threshold leakage (arrow 84).

It should be understood that the foregoing description of preferred embodiments are presented for the purpose of illustrating and describing the main points and concepts of the present invention. The present invention is not limited, however, to these embodiments. For example, alternate embodiments may utilize different methods for depositing and removing the films without departing from the scope and spirit of the present invention. Alternate embodiments may also utilize films having a film thickness different than that described for the preferred embodiments. Other processing details, such as the method for planarizing the structure, may also be varied while within the scope of the present invention. The present invention provides a structure and a method for producing a structure which serves as an isolation structure for use within a semiconductor device. The structure is a substantially divot-free shallow trench isolation device wherein a nitride film is not present at or near the corners of the isolation device but may be included within the trench device.

A major advantage of the present invention is the effect of the produced structure upon the threshold voltage and associated Vt implant, as indicated by electrical measurement. The key feature is minimizing the divot so that the threshold voltage is not lowered, and the Vt implant need not be increased. The method of the present invention may in some cases, produce a structure where a small divot is discernable using an analytical procedure such as scanning electron microscopy. The electrical characteristics of such structures are substantially "divot-free " when compared to the structures that are produced when other methods, such as aqueous hydrofluoric acid, are substituted for the gaseous hydrofluoric acid/ammonia mixture of the present invention, to remove the oxide and dielectric films.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A process for forming a substantially divot-free isolation device within an integrated circuit device, said process comprising the steps of:

a) forming an oxide film on a semiconductor surface of a semiconductor substrate;

b) depositing a first silicon nitride film on said oxide film to form a device substrate, said first silicon nitride film having a top surface;

c) forming a trench within said device substrate, said trench extending
   i) through said first silicon nitride film and said oxide film, and
   ii) into said semiconductor substrate, said trench having a trench bottom and a trench wall;

d) forming an oxide liner on at least said trench wall;

e) forming a silicon nitride liner film over said oxide liner on at least said trench wall and forming a silicon nitride cover film having an upper surface over said first silicon nitride film;

f) filling said trench with a dielectric film, said dielectric film having an upper surface extending above said upper surface of said silicon nitride cover film, and forming an intersection between said isolation device and said semiconductor surface;

g) substantially planarizing said isolation device by removing portions of said dielectric film which extend above a plane formed by said upper surface of said silicon nitride cover film, wherein an upper level of said dielectric film is substantially planar with said upper surface of said silicon nitride cover film;

h) removing said silicon nitride cover film and said first silicon nitride film and recessing said silicon nitride liner film below said semiconductor surface to form a divot along said trench wall;

i) substantially filling said divot with an insulating material; and j) removing said oxide film;

wherein a substantially continuous surface is produced at said intersection.

2. The process as in claim 1, further comprising the step of etching said device using a gaseous mixture of hydrofluoric acid and ammonium prior to the step of substantially filling said divot.

3. The process as in claim 1, wherein said step i) comprises the steps of:
   i1) partially filling said divot with a polysilicon film; and
   i2) oxidizing said polysilicon film.

4. The process as in claim 1, wherein said step of filling said trench with said dielectric film comprises a low pressure chemical deposition of a TEOS film.

5. The process as in claim 1, wherein said step of filling said trench with said dielectric film comprises depositing a TEOS film.

6. The process as in claim 1, wherein said step of filling said trench with said dielectric film comprises an ozone assisted chemical deposition of a TEOS film.

7. The process of claim 1, wherein said semiconductor substrate comprises a silicon substrate.

8. The process of claim 1, wherein said step d) comprises forming a thermally-grown oxide film on at least said trench wall.

9. The process of claim 1, wherein said step h) comprises chemically etching using phosphoric acid.

10. The process as in claim 1, wherein said step of substantially planarizing comprises chemical mechanical polishing.

11. The process as in claim 1, further comprising the step of:
   c1) selectively removing a portion of the first silicon nitride film adjacent said trench.

12. The method as in claim 1, wherein said step a) comprises thermally oxidizing said semiconductor substrate, said oxide film consuming a portion of said semiconductor substrate.

13. The process as in claim 1, wherein said step i) comprises filling said divot with a filler oxide film.

14. The process as in claim 1, wherein said step of removing said oxide film comprises chemically etching said oxide film using a gaseous mixture of hydrofluoric acid and ammonium.

15. The process as in claim 13, wherein said filler oxide film comprises a filler TEOS film.

16. The process as in claim 14, wherein a solid product layer is formed over said oxide film, said solid product layer containing silicon, and being partially resistant to diffusion of hydrofluoric acid, and wherein said method of chemically etching is self-limiting.

17. A process for forming a substantially divot-free isolation device within an integrated circuit device, said process comprising the steps of:

a) forming a first oxide film over a semiconductor surface of a semiconductor substrate;

b) depositing a first silicon nitride film over said first oxide film to form a device substrate, said first silicon nitride film having a top surface;

c) forming a trench within said device substrate, said trench extending
   i) through said first silicon nitride film and said first oxide film, and
   ii) into said semiconductor substrate, said trench having a trench bottom and a trench wall;

d) forming an oxide liner on at least said trench wall;

e) forming a silicon nitride liner film over said oxide liner on at least said trench wall and forming a silicon nitride cover film having an upper surface over said first silicon nitride film;

f) filling said trench with a dielectric film, said dielectric film having an upper surface extending above said upper surface of said silicon nitride cover film, and forming an intersection between said isolation device and said semiconductor surface;

g) substantially planarizing said isolation device by removing portions of said dielectric film which extend above a plane formed by said upper surface of said silicon nitride cover film, an upper level of said dielectric film substantially planar with said upper surface of said silicon nitride cover film;

h) removing said silicon nitride cover film and said first silicon nitride film and recessing said silicon nitride liner film below said semiconductor surface to form a divot along said trench wall;

i) removing said first oxide film;

j) forming a second oxide film on at least said semiconductor surface;

k) substantially filling said divot with an insulating material; and l) removing said second oxide film to substantially expose said semiconductor surface;

wherein a substantially continuous surface is produced at said intersection.

18. The method as in claim 17, wherein said step j) comprises thermally oxidizing said semiconductor surface.

19. A process for forming a substantially divot-free isolation device within an integrated circuit device, said process comprising the steps of:

a) forming an oxide film on a semiconductor surface of a semiconductor substrate;

b) depositing a first silicon nitride film on the oxide film to form a device substrate, the first silicon nitride film having a top surface;

c) forming a trench within the device substrate, the trench extending i) through the first silicon nitride film and the oxide film, and ii) into the semiconductor substrate, the trench having a trench bottom and a ii trench wall;

d) forming an oxide liner on at least the trench wall;

e) forming a silicon nitride liner film over the oxide liner on at least the trench wall and forming a silicon nitride cover film having an upper surface over the first silicon nitride film;

f) filling the trench with a dielectric film, the dielectric film having an upper surface extending above the upper surface of the silicon nitride cover film, and forming an intersection between the isolation device and the semiconductor surface;

g) substantially planarizing the isolation device by removing portions of the dielectric film which extend above a plane formed by the upper surface of the silicon nitride cover film, wherein an upper level of the dielectric film is substantially planar with the upper surface of the silicon nitride cover film;

h) removing the silicon nitride cover film and the first silicon nitride film;

i) recessing the silicon nitride liner film below the semiconductor surface to form a divot between at least a portion of the trench wall and the dielectric film;

j) substantially filling the divot with an insulating material; and k) removing the oxide film, wherein a substantially continuous surface is produced at the intersection between the isolation device and the semiconductor surface.

* * * * *